United States Patent [19]

Chanrion

[11] Patent Number: 4,560,960
[45] Date of Patent: Dec. 24, 1985

[54] DIGITAL FREQUENCY SYNTHESIZER FOR GENERATING A FREQUENCY-MODULATED SIGNAL AND RADIO FREQUENCY APPARATUS INCLUDING SUCH A DEVICE

[75] Inventor: Jean C. Chanrion, Paris, France

[73] Assignee: Thomson CSF, Paris, France

[21] Appl. No.: 469,436

[22] Filed: Feb. 24, 1983

[30] Foreign Application Priority Data

Mar. 5, 1982 [FR] France .................................. 82 03733

[51] Int. Cl.[4] ............................................ H03B 19/00
[52] U.S. Cl. ...................................... 331/178; 328/15; 377/52
[58] Field of Search .................... 328/14, 15; 331/178; 332/19; 343/17.2 PC, 18 E; 375/1; 377/47, 52, 110; 455/76

[56] References Cited

U.S. PATENT DOCUMENTS

| | | | |
|---|---|---|---|
| 3,364,437 | 1/1968 | Loposer et al. | 331/1 A |
| 3,548,320 | 12/1970 | Roberts et al. | 377/45 |
| 3,551,826 | 12/1970 | Sepe | 328/160 |
| 3,621,403 | 11/1971 | Seiy | 332/16 R X |
| 3,792,378 | 2/1974 | Hughes et al. | 331/178 |
| 3,993,957 | 11/1976 | Davenport | 377/47 |
| 4,061,973 | 12/1977 | Reimers et al. | 455/76 |
| 4,160,958 | 7/1979 | Mims et al. | 331/178 |
| 4,217,655 | 8/1980 | Michalski | 307/271 X |
| 4,249,138 | 2/1981 | Bell | 331/1 A |
| 4,286,219 | 8/1981 | Gupta | 328/14 |
| 4,296,407 | 10/1981 | Minakuchi | 328/14 X |

FOREIGN PATENT DOCUMENTS

| | | | |
|---|---|---|---|
| 2801525 | 7/1979 | Fed. Rep. of Germany | 332/19 |
| 0005319 | 1/1979 | Japan | 455/76 |
| 2092844 | 8/1982 | United Kingdom | 328/14 |

OTHER PUBLICATIONS

Underhill, M. J., "Universal Frequency Synthesizer I.C. System", Phillips Research Laboratories (Redhill) Annual Review, Great Britain, 1978.

Warwick, G. A. et al., "The Frequency Shifting Synthesizer", The Radio and Electronic Engineer, vol. 50, No. 3, pp. 122–126, (Mar. 1980).

Primary Examiner—Eugene R. LaRoche
Assistant Examiner—Robert J. Pascal
Attorney, Agent, or Firm—Cushman, Darby & Cushman

[57] ABSTRACT

A digital device generating a frequency-modulated signal. The device comprises a programmable divider which divides the frequency $f_H$ of the clock by a variable integer N supplied by a control circuit. The output pulse signal of the frequency divider initiates the supplying of the next value of N by the control circuit. A shaping circuit brings the pulse signal into the form of a signal whose half-cycles successively have a duration equal to an integer multiple N of the clock period $1/f_H$. A supplementary circuit makes it possible to improve the precision of the modulation obtained compared with the desired phase by optionally delaying each half-cycle of the modulated signal by a fraction of the block period. The present invention is applicable to radar and telemetry.

15 Claims, 10 Drawing Figures

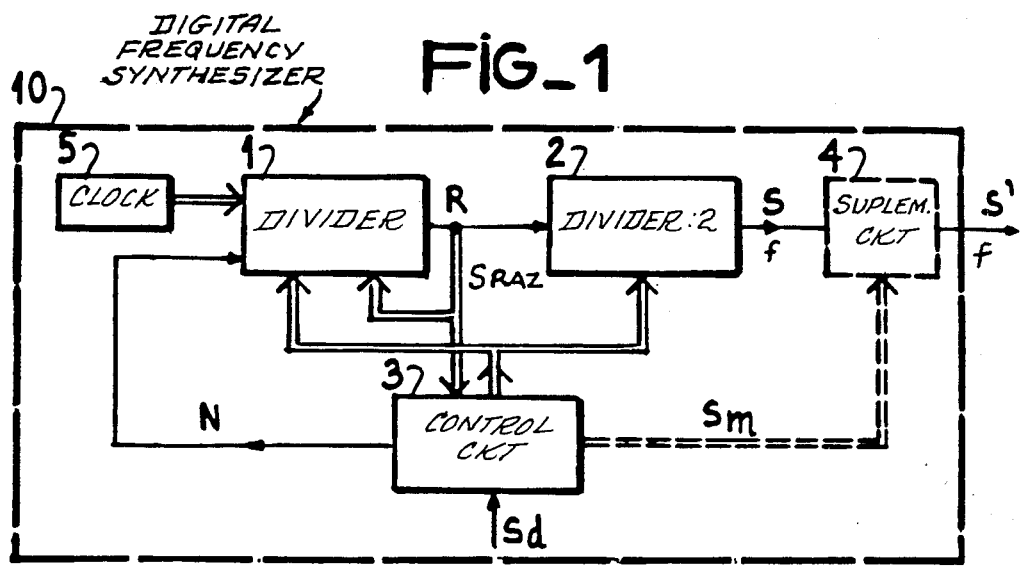
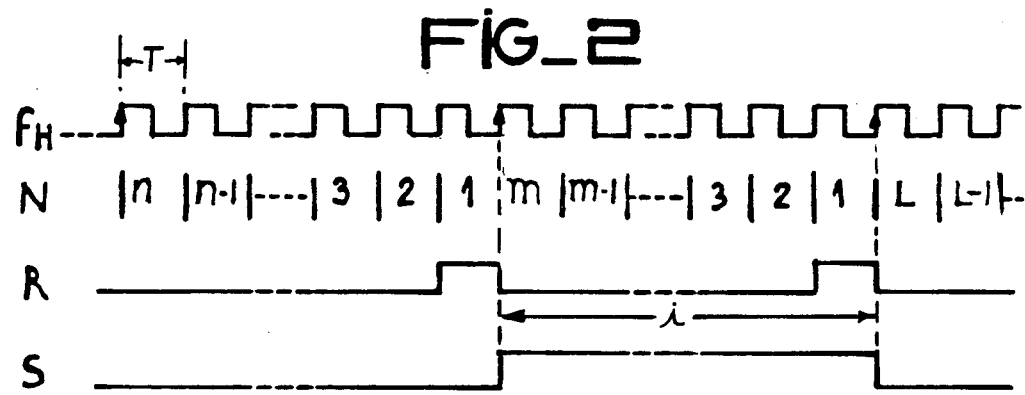
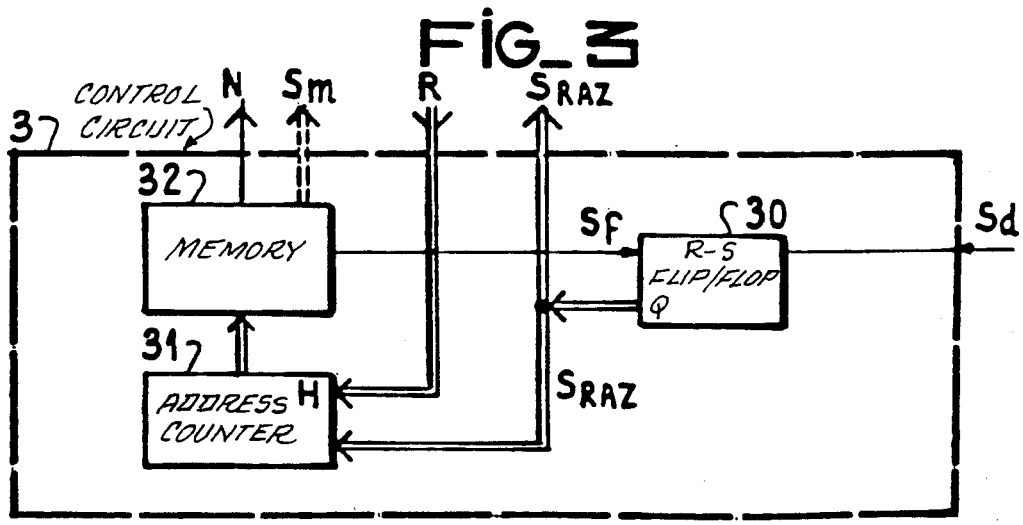

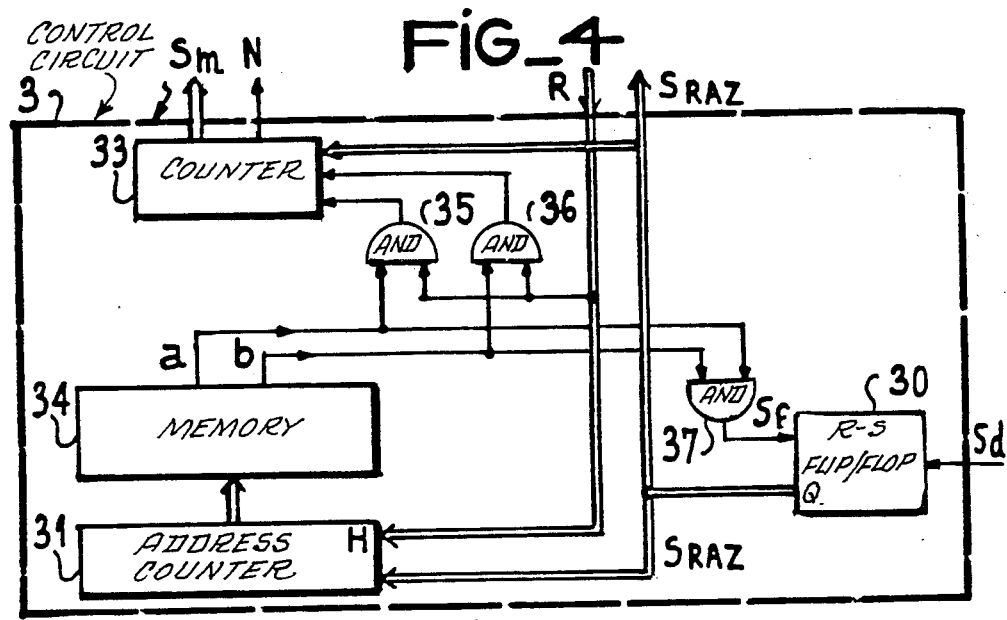
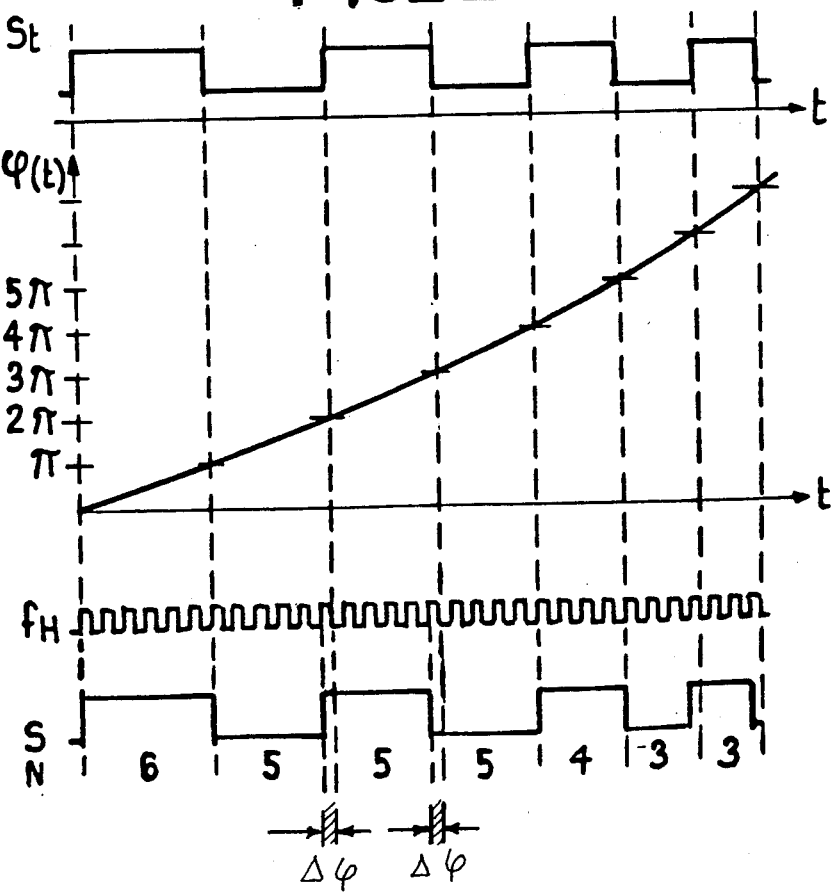

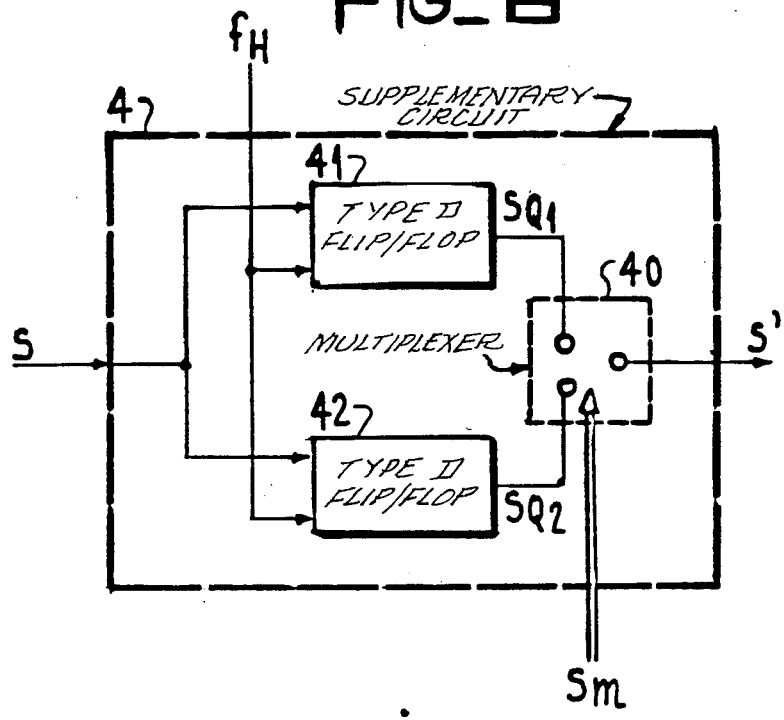
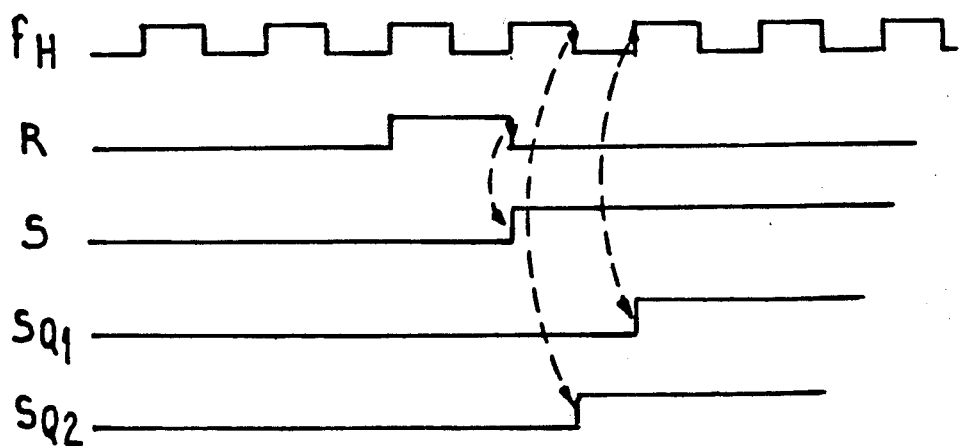

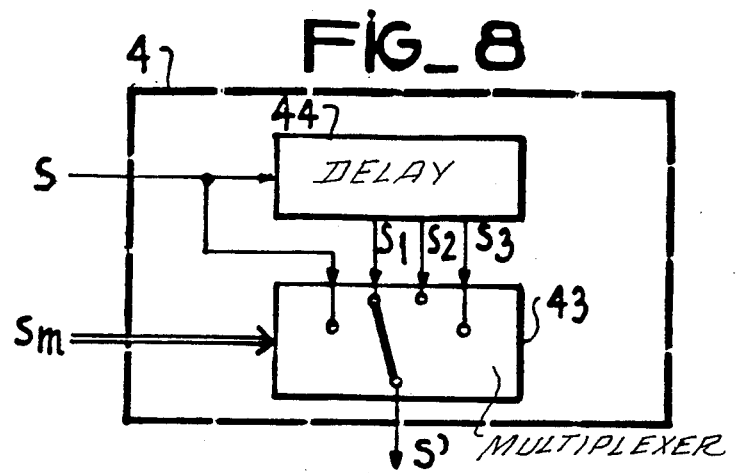
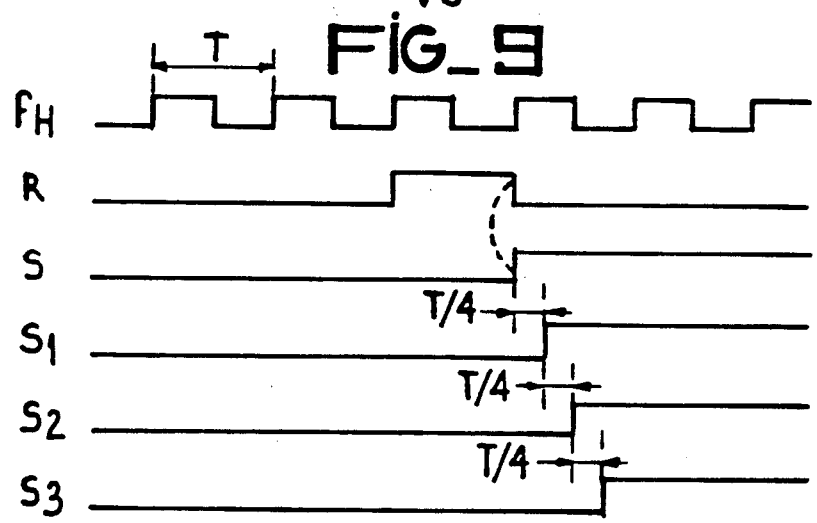
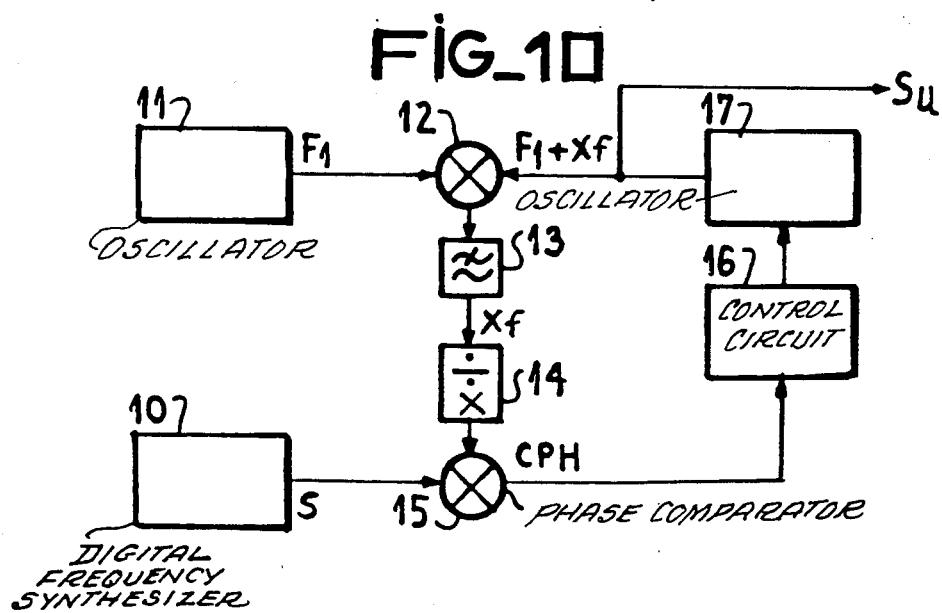

DIGITAL FREQUENCY SYNTHESIZER FOR GENERATING A FREQUENCY-MODULATED SIGNAL AND RADIO FREQUENCY APPARATUS INCLUDING SUCH A DEVICE

BACKGROUND OF THE INVENTION

The present invention relates to a digital frequency synthesizer for generating a frequency-modulated signal and to a radio frequency apparatus including such a device.

It is sometimes necessary to generate a signal having a very accurate phase or frequency modulation. This is, for example, the case with altimeters or telemeters, which use a signal having linear frequency modulation.

The circuits generating such a signal can be produced by purely analog technology, which requires very high quality components, or by digital technology using programmable phase shifters, as in U.S. Pat. No. 4,160,958. Apart from its complexity of construction, the latter method suffers from the main disadvantage of using a programmable phase shifter, which is an analog precision element and whose construction is particularly difficult when requiring a high stability in both temperature and time.

BRIEF SUMMARY OF THE INVENTION

The digital device according to the invention obviates the aforementioned disadvantages and delivers a frequency-modulated square-wave signal.

The digital device according to the invention requires no setting and makes it possible to very accurately generate any form of frequency modulation, no matter what the carrier frequency.

It also has the advantage of being simple, inexpensive, reliable and insensitive to temperature and ageing.

The present invention more specifically relates to a digital device for generating a signal which is frequency modulated, said device comprises:

means for generating a clock signal of time cycle $T = 1/f_H$, where $f_H$ is the clock frequency;

programmable dividing means for generating a pulse signal R, each cycle i (i=0 to n) of the pulse signal is a whole multiple N (where N is a whole integer varying from 0 to n) of the clock period T, and the pulse width of the pulse signal is equal to a clock period T;

means for shaping said pulse signal into a signal S, whereof half-cycles respectively correspond to the cycles of the pulse signal R; and means for controlling said shaping means and said programmable dividing means, and for successively supplying ones of a plurality of natural integers N=(0, 1, 2, . . . n) to the divider means.

BRIEF DESCRIPTION OF THE DRAWINGS

The invention is described in greater detail hereinafter relative to non-limitative embodiments and with reference to the attached drawings, which show:

FIG. 1—the block diagram of the digital frequency synthesizer according to the invention.

FIG. 2—the signals $f_H$, R and S, at several points of the device of FIG. 1.

FIGS. 3 and 4—two different embodiments of the control circuit of the digital frequency synthesizer according to the invention.

FIG. 5—representation of the phase error between the real signal and the theoretical signal.

FIGS. 6 and 8—block diagrams of a supplementary circuit which may be included in the preferred embodiment of the present invention.

FIGS. 7 and 9—the signals $f_H$, R, S, $S_{Q1}$, and $S_{Q2}$, at several points of the circuits of FIGS. 6 and 8, respectively.

FIG. 10—a block diagram of the present invention incorporates into a phase loop circuit.

DETAILED DESCRIPTION OF THE PREFERRED EMBODIMENTS

FIG. 1 shows the block diagram of the digital frequency synthesizer 10 according to the invention, permitting the generation of a frequency-modulated signal.

The desired signal S is obtained by a division, in a programmable divider 1, of the frequency $f_H$ of a reference clock 5 (i.e., $F_H/N$). The divisor N is a whole integer and can be modified from one counting cycle to the next (i.e., N=n for one counting cycle N=m for another counting cycle). This makes it possible to generate a pulse signal R, which has a cycle of variable duration 0T, 1T . . . mT, nT. N is a random natural integer varying from 0 to n and $T=1/f_H$, the period of the clock signal having a frequency $f_H$. The divisor N is supplied to divider 1 from control circuit 3. According to a preferred embodiment, circuit 1 is a programmable decrementing counter whose operation will be described hereinafter.

Divider 1 supplies the fine pulse signal R to the control circuit 3 and to a circuit 2, which is here a divide by two divider which gives the pulse signa R a shape as shown in FIG. 2. Each half-cycle of squarewave signal S obtained in this way has a variable duration, 0T, 1T, 2T, . . . lT, mT, nT.

This is a frequency-modulated signal.

The precision of the frequency modulated signal S, when compared with the desired modulation, can optionally be improved by a supplementary circuit 4. The signal supplied by circuit 4 is designated S'. In certain embodiments circuit 4 can be inserted between the divider 1 and the divide by two divider 2. However, in the preferred embodiment supplementary circuit 4 is placed after the divider 2.

The operation of supplementary circuit 4 will be described below in connection with FIGS. 6 and 8, which give two non-limitative preferred embodiments of said circuit 4.

Circuit 3, controlling the successive divisors N, also starts up the frequency synthesizer 10 upon receipt of an external control signal Sd. Circuit 3 also stops and reinitializes the circuits 1 and 2 by supplying a signal $S_{RAZ}$ and eventually the circuit 4 by supplying a signal $S_m$.

The principle of operation of the digital generation device is described hereinafter with reference to FIGS. 1 and 2.

FIG. 2 shows the signal $f_H$, R, and S at different points of the device. According to a non-limitative embodiment of the invention, the programmable divisor circuit 1 is a decrementing counter which, after being loaded with a value N=n, supplied by circuit 3, performs a decrementation by one integer at each clock cycle, until the value N=0 is reached. At the same time as the programmable decrementing counter 1 displays the value 0, it supplies a so-called carry-over pulse R to divide by two divider 2. Signal R is also provided to control circuit 3 which then supplies the next value of N, (N=m), to the decrementing counter 1. As hereinbefore described, counter 1 decrements by one integer at each clock cycle and supplies a carry-over pulse R when counter 1 reaches 0. Counter 1 is then loaded by the next value N=m and the above process is repeated until all values of N are exhausted and the desired sequence ended.

According to a not shown embodiment, the programmable divisor 1 can be an incrementing counter which, after having been loaded by a value N=0, supplied by circuit 3, performs an incrementation by one integer at each clock cycle until the value $N_M$ is reached, where $N_M$ is the maximum value which can be displayed by the counter. At the same time as the programmable counter displays the value $N_M$, it supplies a carry-over pulse R, which also controls the supplying by circuit 3 of the following divisor N=1 into the counter and so on.

As stated hereinbefore, the starting, stopping and reinitialization of the circuits of frequency synthesizer 10, when the desired sequence has been obtained, are ensured by the control circuit 3, whereof two non-limitative embodiments are given in FIGS. 3 and 4.

The divide by two divider 2 is supplied with the carry-over signal R. Signal R is formed by fine pulses, each cycle having a variable duration NT. Divider 2 supplies a signal S, whereof each of the half-cycles has a variable duration NT and covers one period of the carry-over pulse R. Signal S is frequency-modulated and its phase defined by the sequence N=0 to n is very close to that of the desired signal. Therefore, by an appropriate choice of the divisor N, device 10 can generate any frequency modulation form, the simplest being a liner modulation.

Such a digital frequency synthesizer works over a frequency range from d.c. to a few tens of megahertz. However, by inserting it into a phase-locked loop, in accordance with a per se known procedure, it is possible to obtain the desired modulation on any random carrier frequency. Such a phase-locked loop is shown in FIG. 10 and will be described hereinafter. The digital frequency synthesizer 10 supplies a signal to to a phase comparator 15. It is to be stressed that only the phase is exploited and that the shape of the signal is a secondary characteristic and will be considered as such in the remainder of the description. Thus, the object of the invention is to generate a frequency-modulated, square signal.

FIG. 3 shows a preferred detailed embodiment of control circuit 3. It comprises a memory 32, containing the divisors N which, decremented by 1, must be successively loaded into the programmable decrementing counter 1 of FIG. 1. Memory 32 also contains a bit, which is delivered in the form of an end-of-sequence signal $S_f$ to a R-S flip-flop 30, when the content of memory 32 has been entirely scanned. At its second input, flip-flop 30 receives an external control signal $S_d$, which initiates the scanning of the memory content and the operation of frequency synthesizer 10. The output of flip-flop 30 is a $S_{RAZ}$ signal for resetting or reinitializing the programmable decrementing counter 1 and the divide by two divider 2 of FIG. 1 and an address counter 31, which controls the scanning of the content of memory 32. The incrementation of address counter 31 by one integer is initiated by the arrival of a carry-over pulse of the signal R delivered by programmable decrementing counter 1, when it displays the value 0.

If the digital frequency synthesizer 10 also comprises a circuit 4, making it possible to improve the accuracy of the phase of signal S obtained at the output of the divider by two 2, memory 32 contains a supplementary bit for controlling the circuit 4. This supplementary bit is delivered in the form of a control signal $S_m$.

FIG. 4 shows another preferred embodiment of the circuit 3 of FIG. 1. The frequency variation of the desired signal is very often small between two successive half-cycles. The variation between two successive divisors is then very small, i.e. at the most equal to 1. This case is studied hereinafter with reference to FIG. 5, which shows the approach of a theoretical signal $S_t$ of phase $\phi(t)$ by a signal S generated by frequency synthesizer 10 from clock signal $f_H$ and divisors N, the phase error being designated as $\Delta\phi$.

It is possible to demonstrate that the acceptance of a variation of one integer in the divisors N from one counting cycle to the next makes it possible to generate considerable slopes. Therefore it is no longer necessary for the memory of control circuit 3 to contain all the values of divisors N. It is sufficient for it to contain the initial divisor $N_o$ linked with the initial frequency $f_o$ of the modulated signal S and with the clock frequency $f_H$, related by the equation $f_o = f_H/2N_o$, as well as the variation of each value of N, (N=1, ..., n) with respect to the preceding value of N. Thus, the necessary memory capacity is well below that of memory 32 in the first embodiment of control circuit 3 of FIG. 3.

Thus, control circuit 3 is shown in FIG. 4 where references 30 and 31 designate circuits identical to those used in FIG. 3, namely a R-S flip-flop 30 which receives a starting signal $S_d$ and an end-of-sequence signal $S_f$ and supplies a resetting or reinitialization signal $S_{RAZ}$, as well as an address counter 31, whose resetting is ensured by the signal $S_{RAZ}$ from flip-flop 30 and which controls a memory 34 at the arrival of each fine carry-over pulse of signal R (from the programmable divisor 1 of FIG. 1) at its clock input H.

Memory 34 only requires a capacity below that of memory 32 in FIG. 3 and supplies pulses a and b for the incrementation or decrementation of a counter 33 via a system of AND gates 35, 36.

AND gate 35, or 36, receives at its first input bit a, or b, and at its second input the carry-over pulse signal R which is supplied by the programmable divisor 1 of FIG. 1. AND gates 35 and 36 supply a signal controlling the decrementation or incrementation of counter 33 whose presetting is controlled by the output signal $S_{RAZ}$ of the R-S flip-flop 30.

The two bits a and b are also combined by an AND gate 37 into an end-of-sequence signal Sf, which is applied to the input of the R-S flip-flop 30.

As a function of their state, bits a and b have the following meanings:

a=0 and b=0 no decrementation or incrementation of counter 33;
a=0 and b=1 counter 33 is incremented by one unit;
a=1 and b=0 counter 33 is decremented by one unit;
a=1 and b=1: the sequence is stopped and resetting takes place, because R-S flip-flop 30 receives an end-of-sequence signal $S_f$.

The counter 33 supplies the programmable divisor 1 of FIG. 1 with the divisor N. It, optionally, also supplies a control signal $S_m$ to circuit 4 of FIG. 1, which makes it possible to use lower clock frequencies with the same phase precision.

According to a non-limitative embodiment, this control signal $S_m$ can be constituted by the least significant bit, the other bits being applied to the input of programmable divisor 1 (FIG. 1).

The time increment used for the generation of the signal is clock period $T=1/f_H$. The divisor N is determined so that the state changes of output signal S take place at the ideal moment $\pm T/2 = \pm 1/2f_H$. The maximum phase error $\Delta\phi$ created in this way is equal to:

$$\Delta\phi = \frac{\frac{2\pi T}{2}}{\frac{1}{f}} = \frac{\pi f}{f_H},$$

in which f is the frequency of signal S generated by device 10. Thus, the clock frequency can be chosen as a function of the desired phase accuracy.

If it is necessary to obtain a particularly accurate frequency modulation, a first solution consists of using a very high clock frequency $f_H$, e.g. approximately 100 MHz or higher. However, a programmable division at such a frequency is particularly difficult to perform and very few components exist which allow this to be carried out.

It is therefore of interest to be able to retain the same phase precision $\Delta\phi$ while reducing the clock frequency.

FIGS. 6 and 8 give two non-limitative embodiments of circuit 4 of FIG. 1, making it possible to work at a lower clock frequency than that necessary in the absence of such a circuit 4, while ensuring an identical phase accuracy.

In the case of the embodiment of FIG. 6, described hereinafter with reference to FIG. 7 showing the signals at different points of the circuit, it is assumed that the clock signal has a shape as shown in FIG. 7. The output signal S of the divide-by-two circuit 2 supplies the first input of two D-type flip-flops 41 and 42 which receive at their second input the clock signal of frequency $f_H$ and operate on the rising front of signal S, and falling front respectively.

Output SQ1, or SQ2, of flip-flop 41, or 42, is applied, respectively, to the first, or second, input of a multiplexer 40 which is controlled by signal $S_m$ supplied by circuit 3 (by counter 33 of FIG. 4 or memory 32 of FIG. 3).

In view of the operating mode of the two flip-flops 41 (rising front) and 42 (falling front), the two output signals SQ1 and SQ2 are time-displaced by a half-clock period.

Multiplexer 40, controlled by signal Sm, selects, at each half-period, signal SQ1 or SQ2, which it supplies at its output. Signal S' is therefore formed by half-periods belonging either to SQ1 or to SQ2. The precision of the phase is consequently multiplied by two for the same clock frequency.

FIG. 8 shows another embodiment of circuit 4 making it possible to improve the phase accuracy of the signal generated by frequency synthesizer 10 according to the invention (FIG. 1). The signals generated at different points of this circuit are shown in FIG. 9, to which reference is also made hereinafter.

Circuit 4 of FIG. 8 uses a delay line 44 having a number M of output stages (three in FIG. 8) spaced by $T/M+1$, T being the period $1/f_H$ of the clock signal.

The signal S at the output of divide by two divider (FIG. 1) is applied to the input of delay line 44 and to a first input of a multiplexer 43. Multiplexer 43 has $(M+1)$ inputs and is controlled by control signal Sm which is supplied by circuit 3 of FIG. 3 (at the output of memory 32) or FIG. 4 (at the output of counter 33).

The M other inputs of multiplexer 43 are supplied by signals $S_1, \ldots, S_M$ supplied by the M output stages of delay line 44. These signals correspond to the signal S delayed, for the stage $j(j=1, \ldots, M)$, by $jT/(M+1)$ compared with signal S. This is shown in FIG. 9 for $M=3$.

Like multiplexer 40 of the embodiment of FIG. 6, multiplexer 43 chooses, at each half-period among the $(M+1)$ inputs which are respectively supplied by signals $S, S_1, \ldots, S_j, \ldots, S_M$, the signal best adapted for obtaining the best phase precision. In this embodiment, the precision is improved in a ratio $(M+1)$.

It should be noted that it is advantageous to use a delay line such that $(M+1)$ is a multiple of two. Thus, the control of the multiplexer can be directly supplied by the counter 33 of FIG. 4 when circuit 4 is used in combination with circuit 3 of FIG. 4.

It should also be noted that in the embodiment of FIG. 8, circuit 4 is supplied by the output signal S of the divide by two divider 2. The represented circuit 4 could also be inserted between the programmable decrementing counter 1 and the divide by two divider 2 according to a not shown embodiment of the device of FIG. 1. In such an embodiment, the circuit 4 of FIG. 8 is then no longer supplied by signal S, but by the carry-over signal R, provided that the control of multiplexer 43 takes place at a time where the signal is stable, so as to cause no inteference on the output signal. The output of such a circuit is a phase precise pulse signal R'.

FIG. 10 shows an example of a phase-locked loop, whose technology is known, but which uses a digital frequency synthesizer 10 according to the invention. As stated hereinbefore, the frequency of the generated signal is in the frequency range accessible to digital circuits, i.e. over a range from d.c. to a few tens of MHz.

The phase-locked loop of FIG. 10 makes it possible to transpose this signal to any random carrier frequency and consequently obtain a signal, e.g. a microwave frequency signal, having a very precise frequency modulation.

In the non-limitative embodiment of FIG. 10, f is the frequency of signal S (or S' if there is a phase-precision circuit 4) supplied by digital device 10 according to the invention and $F_1$ is the fixed frequency of oscillator 11. The frequency of the useful signal $S_u$ at the output of the frequency-controlled oscillator 17 is $(F_1+Xf)$.

The useful signal $S_u$ is supplied to mixer 12, which receives at its second input the output signal from oscillator 11 at fixed frequency $F_1$. The output signal of mixer 12 passes through a low-pass filter 13 to supply frequency Nf to a divide-by-X circuit 14.

A phase comparator 15 receives at its first input the frequency-modulated signal S or S' of frequency f, supplied by digital frequency synthesizer 10 according to the invention, and receives at its second input the output signal from the divide-by-X circuit 14. The output of phase comparator 15 is used by control circuit 16 for controlling the frequency $(F_1+Xf)$ of oscillator 17.

In this type of application, the digital frequency synthesizer 10 can be further simplified when using, as the phase comparator, a frequency-phase comparator like e.g. comparator II of a CMOS circuit of the 4046 variety. In this case only the rising fronts are used. There is consequently no need to generate the two fronts of signal S and only one has to be generated.

The programmable decrementing counter 1 then no longer counts half-periods and instead counts complete cycles of the signal to be generated. Therefore, for the same signal, half the number of decrementation cycles are required. As a result the memory capacity of circuit 3 can be divided by two.

Thus, a very high performance device has been described, which digitally generates a signal having a random frequency modulation, while using a clock frequency permitting the use of less fast circuits, e.g. TTL instead of ECL. The invention is applicable to microwave frequency radars.

What is claimed is:

1. Digital frequency synthesizer apparatus for generating a frequency modulated output signal S, comprising:
   clock means for providing a clock signal having a frequency $f_H$ and a period $T = 1/f_H$;
   programmable divider means, connected to said clock means, for receiving said clock signal and generating a pulse signal R which has a variable cycle equal to NT (where N is a whole integer which can take any value from 0 to n) and a pulse width equal to T;
   shaping means, connected to said programmable divider means, for receiving said pulse signal R and producing said output signal S which has a half-cycle corresponding to said pulse signal cycle; and
   control means, connected to said programmable divider means and to said shaping means and adapted to receive a control signal $S_d$, for successively supplying the values of N to said programmable divider means in accordance with said control signal $S_d$ so that said output signal S is frequency modulated according to a sequence of values of N.

2. Apparatus according to claim 1 wherein said programmable divider means includes a decrementing counter which is set to N at the beginning of said pulse signal cycle and decreases, by a whole integer during each clock cycle, to 0 whereupon the next successive value of N is supplied to said decrementing counter from said control means.

3. Apparatus according to claim 1 wherein said programmable divider means includes a programmable counter which is set to $N_M + 1 - N$ (where $N_M$ equals the maximum count of said programmable counter) at the beginning of said pulse signal cycle and increases, by a whole integer during each clock cycle, to $N_M$ whereupon the next successive value of N is supplied to said programmable counter from said control means.

4. Apparatus according to claim 1 wherein said shaping means includes a divide-by-two circuit which supplies said output signal S having half-cycles equal to NT where the value of N varies as commanded by said control signal $S_d$.

5. Apparatus according to claim 1 wherein said control means includes:
   address counting means for successively generating one of a plurality of address gianls each time said pulse signal cycle is complete;
   memory means, connected to said address counting means, for storing said values of N, and for supplying successive values of N to said programmable divider means in accordance with said address signals, and for generating an end-of-sequence signal $S_f$ when all of the values of N for a sequence have been supplied to said programmable divider means; and
   flip-flop means, connected to said address counting means and said memory means and adapted to receive said control signal $S_d$, for generating an initialization signal $S_{RAZ}$ which initializes said programmable divider means and said shaping means and resets said address counting means upon receipt of said control signal $S_d$ or said end-of-sequence signal $S_F$.

6. Apparatus according to claim 5 wherein said memory means includes a read-only-memory in which each of said values of N is assigned a unique address, with the address $A_N$, which contains a last one of said sequence of values of N, also including a first and second bit corresponding to said end-of-sequence signal $S_f$ and a control signal $S_m$, respectively.

7. Apparatus according to claim 5 wherein said memory means includes:
   counter means for supplying said successive valueS of N to said programmable divider means, said counter means storing said values of N in a predetermined sequence beginning with an initial value $N_o$, whereby said initial value $N_o$ is supplied upon receipt of said initialization signal $S_{RAZ}$ and successive values of N are supplied by incrementing or decrementing or holding the count of said counter means constant in accordance with the receipt of command bits a and b;
   read-only-memory means for receiving said address signals from said address counting means and generating said command bits a and b in accordance with said address signals, and for combining each of said bits a and b with said pulse signal R so as to provide said bits a and b to said counter means once during each pulse signal cycle, and for generating said end-of-sequence signal $S_f$.

8. Apparatus according to claim 7 wherein said counter means supplies a control signal $S_m$ which is formed by a least significant bit from each of said successive values of N supplied to said programmable divider means.

9. Apparatus according to claim 1 further comprising supplementary circuit means, connected to said shaping means, for receiving said output signal S and generating a phase precise output signal S' whereby said apparatus may be used with a low clock frequency, said supplementary circuit comprising:
   delay means, having M outputs and receiving said clock frequency $f_H$ and said output signal S, for delaying said output signal S and providing delayed signals $S_1 \ldots S_M$ at said M outputs, respectively, each of said delayed signals being delayed by a period equal to $jT/(M+1)$ (where j = the sequential number of said outputs 1 to M); and
   multiplexing means, connected to said delay means and receiving a control signal $S_M$ from said control means, for selecting at each pulse signal cycle one of said delayed signals $S_1 \ldots S_M$ in accordance with said control signal $S_M$ to produce said phase precise output signal S'.

10. Apparatus according to claim 9 wherein said delay means includes two type D flip-flops, one operating on a rising front of said clock signal and the other operating on a falling front of said clock signal.

11. Apparatus according to claim 9 wherein said delay means includes a delay line having M outputs.

12. Apparatus according to claim 1 further comprising supplementary circuit means, connected to said programmable divider means for receiving said pulse signal R and generating a phase precise pulse signal R' whereby said apparatus may be used with a low clock frequency, said supplementary circuit comprising:

delay means, having M outputs and receiving said clock frequency $f_H$ and said pulse signal R, for delaying said pulse signal R and providing delayed signals $R_1 \ldots R_M$ at said M outputs, respectively, each of said delayed signals being delayed by a period equal to $jT/(M+1)$ (where j = the sequential number of said outputs 1 to M); and multiplexing means, connected to said delay means and receiving a control signal $S_M$ from said control means, for selecting at each pulse signal cycle one of said delayed signals $R_1 \ldots R_M$ in accordance with said control signal $S_M$ to produce said phase precise pulse signal R'.

13. Apparatus according to claim 9 wherein said multiplexing means includes a multiplexer having (M+1) inputs and one output.

14. Radio-frequency apparatus for providing a phase precise, digitally-generated, frequency-modulated signal $S\mu$, comprising:

digital frequency synthesizer apparatus for generating a frequency modulated output signal S, including:

clock means for providing a clock signal having a frequency $f_H$ and a period $T = 1/f_H$;

programmable divider means, connected to said clock means, for receiving said clock signal and generating a pulse signal R which has a variable cycle equal to NT (where N is a whole integer varying between 0 and n) and a pulse width equal to T;

shaping means, connected to said programmable divider means, for receiving said pulse signal R and producing said output signal S which has a half-cycle corresponding to said pulse signal cycle; and control means, connected to said programmable divider means and to said shaping means and adapted to receive a control signal $S_d$, for successively supplying the values of N to said programmable divider means in accordance with said control signal $S_d$ so that said output signal S is frequency modulated according to a sequence of values of N;

a first oscillator providing a signal of fixed frequency $F_1$;

a second oscillator providing said signal $S\mu$ having a controllable frequency $F_2$;

mixer means, connected to said first and second oscillators, for mixing said fixed frequency and said controllable frequency signals and providing a mixed signal of frequency $(F_2-F_1)$;

low pass filter means for receiving said mixed signal and providing a filtered, mixed signal;

divide-by-X circuit means for dividing said filtered, mixed signal and providing a divided signal of frequency $(F_2-F_1)/X$;

phase comparator means, connected to said divide-by-X circuit means and said digital frequency synthesizer apparatus, for comparing the phase of said output signal S and said divided signal and providing a compared signal; and control circuit means for receiving said compared signal from said phase comparator means and supplying a controlling signal to said second oscillator for controlling the frequency of said useful signal $S\mu$.

15. Apparatus according to claim 14 wherein said phase comparator means includes a frequency phase comparator operating on rising or falling fronts, and wherein said digital frequency synthesizer apparatus provides an output signal which has a cycle equal to said pulse signal cycle.

* * * * *